United States Patent [19]

Dropps et al.

[11] Patent Number: 5,103,154

[45] Date of Patent: Apr. 7, 1992

[54] START WINDING SWITCH PROTECTION CIRCUIT

[75] Inventors: Kevin J. Dropps, Berkley, Mass.; Herbert A. Thompson, Cumberland, R.I.

[73] Assignee: Texas Instruments Incorporated, Dallas, Tex.

[21] Appl. No.: 529,034

[22] Filed: May 25, 1990

[51] Int. Cl.$^5$ ............................................. H02P 1/00
[52] U.S. Cl. ................................... 318/782; 361/33
[58] Field of Search ............... 318/753, 778, 786, 782, 318/289, 788, 817; 307/632; 361/91, 23, 30, 33, 54, 56, 88, 86, 31

[56] References Cited

U.S. PATENT DOCUMENTS

| | | | |
|---|---|---|---|
| 3,609,461 | 9/1971 | Obenhaus et al. | 361/31 X |
| 3,660,687 | 5/1972 | Sahm, III et al. | 307/632 |
| 3,740,632 | 6/1973 | Whitney et al. | 318/289 |
| 3,761,792 | 9/1973 | Whitney et al. | 318/788 |
| 3,777,232 | 12/1973 | Woods et al. | 318/786 |
| 3,904,931 | 9/1975 | Leidich | 361/91 |
| 4,196,462 | 4/1980 | Pohl | 361/33 |
| 4,399,394 | 8/1983 | Ballman | 318/817 X |
| 4,719,399 | 1/1988 | Wrege | 318/786 |
| 5,017,853 | 5/1991 | Chemiel | 318/786 |

Primary Examiner—William M. Shoop, Jr.
Assistant Examiner—A. Jonathan Wysocki
Attorney, Agent, or Firm—Russell E. Baumann; Rene' E. Grossman; Richard L. Donaldson

[57] ABSTRACT

A single phase, capacitor start electric motor is shown in which energization of the auxiliary winding is controlled by a triac. The triac is protected from excessive voltages caused by the vector sum of capacitor, line and induced voltages which can occur at turn-off of the triac. The triac is protected in several embodiments by a gated semiconductor switch serially connected to a current limiting or discharge resistor, both being coupled across the triac. The semiconductor switch has a voltage breakdown device connected in its gate circuit. When voltage across the triac exceeds a selected level the gated semiconductor is turned on thereby drawing sufficient current momentarily to limit the voltage across the triac to a safe level and allowing the capacitor to discharge its voltage through the auxiliary winding circuit. In another embodiment a stack of high voltage bilateral triggering devices is placed across the triac.

9 Claims, 5 Drawing Sheets

START WINDING SWITCH PROTECTION CIRCUIT

FIELD OF THE INVENTION

This application relates generally to starting single phase electric motors and more particularly to starting capacitor start, single phase motors wherein a solid state device is used for an auxiliary winding switch.

BRIEF DESCRIPTION OF THE PRIOR ART

It is well known to use solid state switches such as triacs or back to back SCR's in series with the auxiliary winding to control the energization thereof in single phase motors however when used with capacitor start motors a problem occurs in that a high voltage appears across the switch when it is turned off. The high voltage is due to a peak voltage charge left on the motor capacitor at turn-off which is added to the vector sum of line voltage and induced auxiliary winding voltage already present across the auxiliary winding switch. This problem is particularly vexatious in higher voltage motors, such as 230 volt motors, where the turn off voltage across the auxiliary winding switch can exceed the breakdown voltage rating of available triacs or SCR's.

The prior art has addressed this problem in several ways including the use of two or more series connected triacs to split the turn off voltage across an individual triac to a safe level. While this is technically effective it is unsatisfactory in that it is a costly solution due to the extra components required.

Another way of dealing with the problem is to reduce the value of the bleeder resistor conventionally used across the capacitor however this approach requires such a high wattage value to discharge the capacitor quickly at turn off that it would dissipate excessive power during the time that the auxiliary winding is energized.

Yet another approach has been to place a pair of serially connected triacs in series with the auxiliary winding and start capacitor and to place a resistor across each triac to rapidly discharge the start capacitor to reduce the value of voltage across the auxiliary winding switch after it turns off keeping the voltage on the triacs from exceeding the breakdown voltage. However this approach still involves leakage current in the auxiliary winding with concomitant power dissipation and higher than desirable power dissipation requirements for the discharge resistors.

Still another approach is the use of a semiconductor switch connected in parallel with the motor start capacitor to quickly discharge the capacitor through the semiconductor switch when the auxiliary switch is de-energized, as shown and described in U.S. Pat. No. 4,719,399. While this approach is effective to quickly discharge the start capacitor there are several disadvantages associated therewith. As described in the patent the auxiliary switch is commanded to turn on when an auxiliary winding switch turn-off command is generated, however, due to inherent delays in comparator operation, the auxiliary switch triggering circuit actually receives a command to turn on slightly before the auxiliary winding switch triggering circuit receives a command to turn off. Depending upon when the auxiliary winding switch actually turns off at zero current and when the auxiliary switch turns on it is possible for both switches to be on at the same time up to a maximum of one half cycle time period. Another disadvantage is that the auxiliary switch light emitting diodes 108,110 remain on while the motor is energized unless an auxiliary winding switch turn on command is generated thereby wasting power once the motor start capacitor is discharged when the motor is energized.

It is therefore an object of the invention to provide improved apparatus for starting a capacitor start, single phase motor. Yet another object is the provision of a low cost, reliable circuit for starting such motors which enables the use of a single conventional triac as an auxiliary winding switch.

Briefly, in accordance with the invention, a semiconductor switch, such as an SCR or a triac, is connected in parallel with the auxiliary switch with a trigger circuit which responds to the voltage across the auxiliary winding switch. The trigger circuit in a first embodiment uses a plurality of series connected zener diodes in an SCR gate circuit wherein the SCR is gated on when the combined voltage breakdown of the zener diodes is exceeded by the voltage across the auxiliary switch in one polarity. In a second embodiment the gate of the SCR is connected through a zener diode to the junction of a capacitor and a resistor coupled across the auxiliary winding switch wherein the SCR is gated on when the voltage across the trigger capacitor exceeds the voltage breakdown of the zener diode. In another embodiment bilateral trigger devices such as sidacs are connected to the gate of a triac and to the junction of a capacitor and resistor coupled across the auxiliary winding switch to provide bipolar protection. In yet another embodiment a stack of sidacs are coupled across the auxiliary winding switch.

Figure 1:
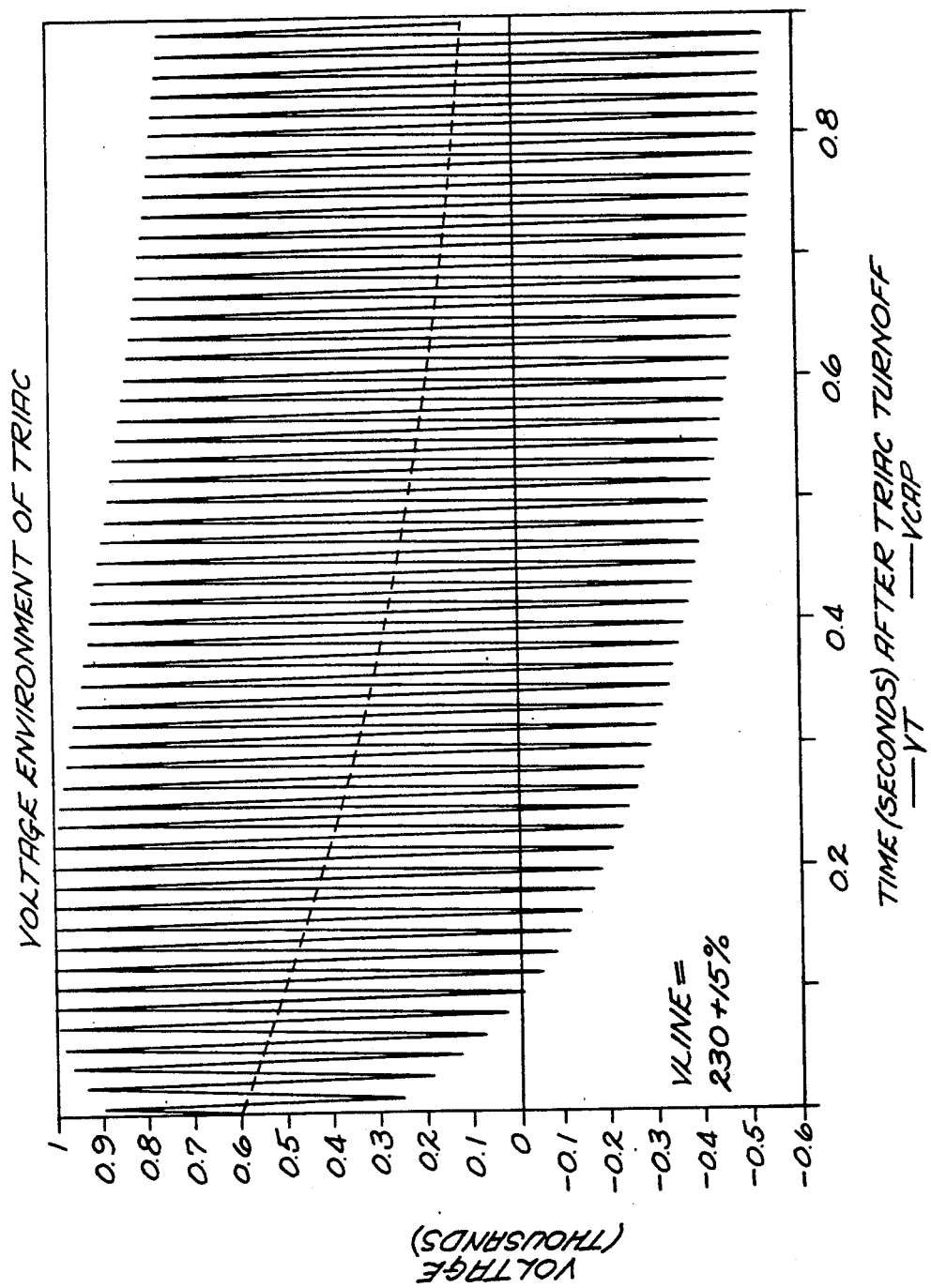
FIG. 1 is a graph showing typical triac voltage follow turnoff when the triac is used as an auxiliary winding switch.

In a capacitor start, single phase motor when a triac is used to de-energize the auxiliary winding, peak voltage is always left on the capacitor when the triac is turned off because of the 90° phase angle between the capacitor voltage and start short circuit current. The triac can turn off only as the current decreases below the holding current value of the triac and at this moment the capacitor voltage is at its peak. The open circuit voltage across the triac is the vector sum of this high DC voltage stored on the capacitor and the AC voltages on the line and induced in the start winding. These three voltages can reach peak values of 1000 to 1100 volts across the triac as shown in FIG. 1 which is, with a 230 volt line input, voltage trace of voltage across a triac serially connected to an auxiliary winding and with a conventional bleeder resistor in parallel with the capacitor during a time interval immediately following turn off of the triac. The bleeder resistor is rated at a few watts and takes a substantial number of cycles to discharge the capacitor. A typical bleeder is far too slow to prevent excessive voltage from appearing across the triac after it turns off and, as seen in FIG. 1, the capacitor voltage biases the AC peaks well above 800 volts, the peak voltage rating for regular production triac.

Figure 2:
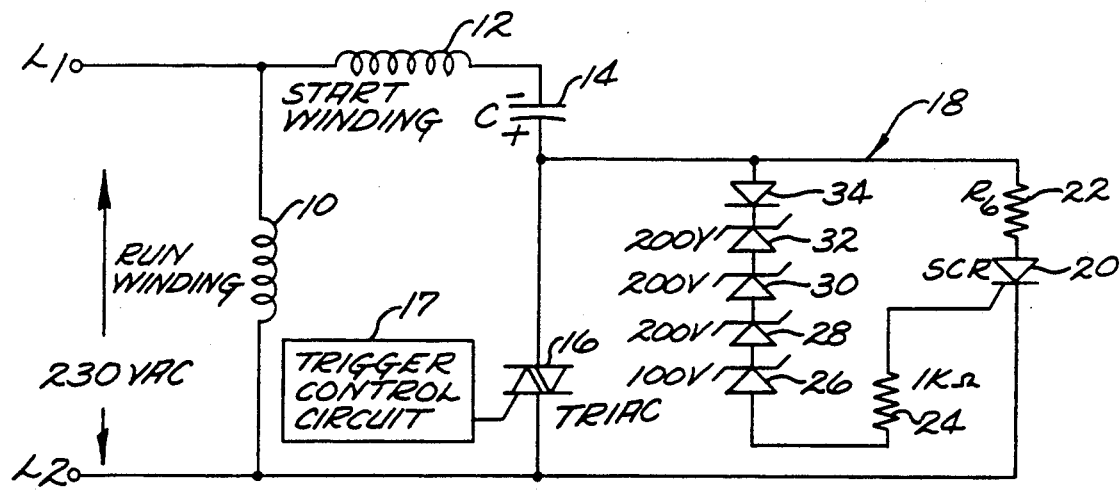
FIG. 2 is a diagram showing an auxiliary winding switch protection circuit made in accordance with a first embodiment of the invention.

As seen in FIG. 2, a run winding 10 is connected across lines L1, L2 and an auxiliary winding 12 is connected in parallel with the run winding 10 and serially connected to start capacitor 14 and auxiliary winding switch 16, in the form of a triac. The gate of triac 16 is coupled to a suitable triggering circuit 17, such as that shown in U.S. Pat. No. 4,843,295, assigned to the assignee of the present invention, in order to energize the triac upon starting or locked rotor conditions and de-energizing the triac when the motor has attained a selected rotational speed.

A protection circuit 18 is coupled across triac 16 and comprises an SCR 20 serially connected to a dissipating resistor 22. The gate of the SCR is connected to a current limiting resistor 24 and a plurality of series connected zener diodes 26, 28, 32 and a rectifying diode 34. The zener diodes are selected so that when the voltage across the triac and the zener diodes exceeds 700 volt (peak), the SCR fires thereby preventing the triac voltage from exceeding 700 volts by connecting a low resistance 22 across the triac.

Figure 2A:
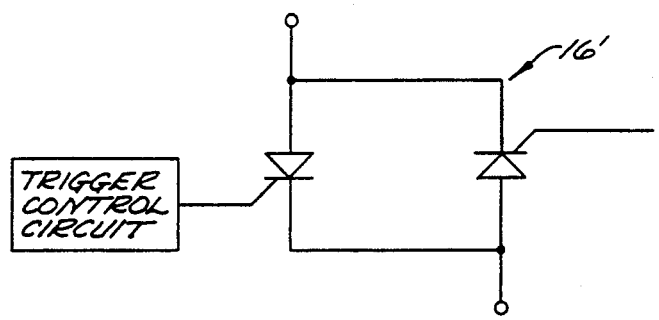
FIG. 2a is a modification of the FIG. 2 circuit.

Although a triac is shown as the auxiliary winding switch it will be realized that the invention applies to other devices used as an auxiliary winding switch such as back to back SCR's 16' as shown in FIG. 2a.

Figure 3:
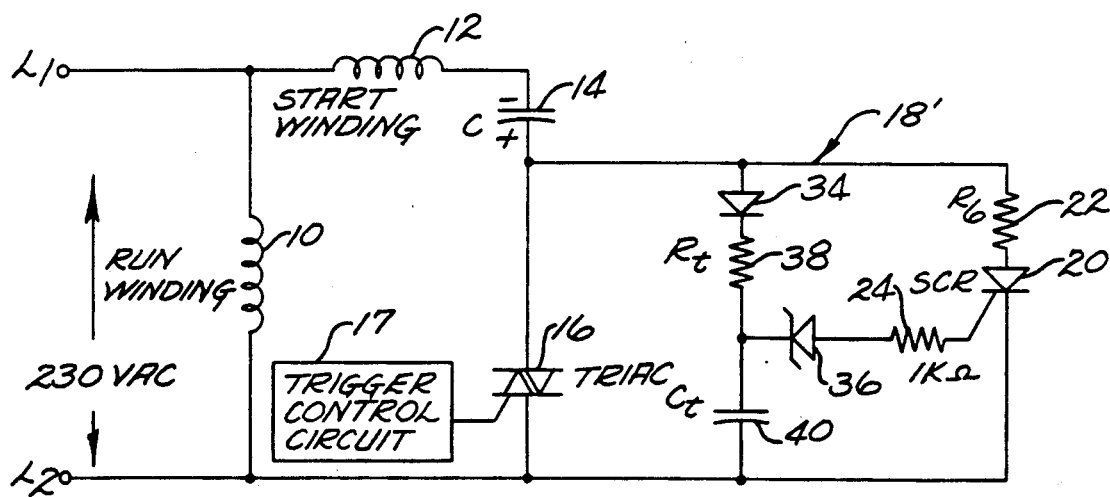
FIGS. 3-5 are diagrams showing alternative embodiments of auxiliary winding switch circuits made in accordance with the invention.

In FIG. 3 the gate of SCR 20 in protection circuit 18' is connected through current limiting resistor 24 and a single zener diode 36 to a junction between resistor 38 and capacitor 40 coupled, along with diode 34, across triac 16. When triac 16 turns off, voltage increases across capacitor 40 until it eventually exceeds the breakdown voltage rating of the zener thereby turning the triac voltage limiting switch on.

The FIGS. 2 and 3 protection circuits each provides a voltage limiting load to pull down the triac voltage by means of a discharge path for the motor start capacitor through the auxiliary winding circuit. Among the advantages that they provide are that they do not require any power from a separate power supply to operate. Further, the triac voltage limiting switch inherently turns off as current through it drops below its holding current rating when the motor start capacitor is discharged and the triac voltage limit is no longer needed.

Figure 4:
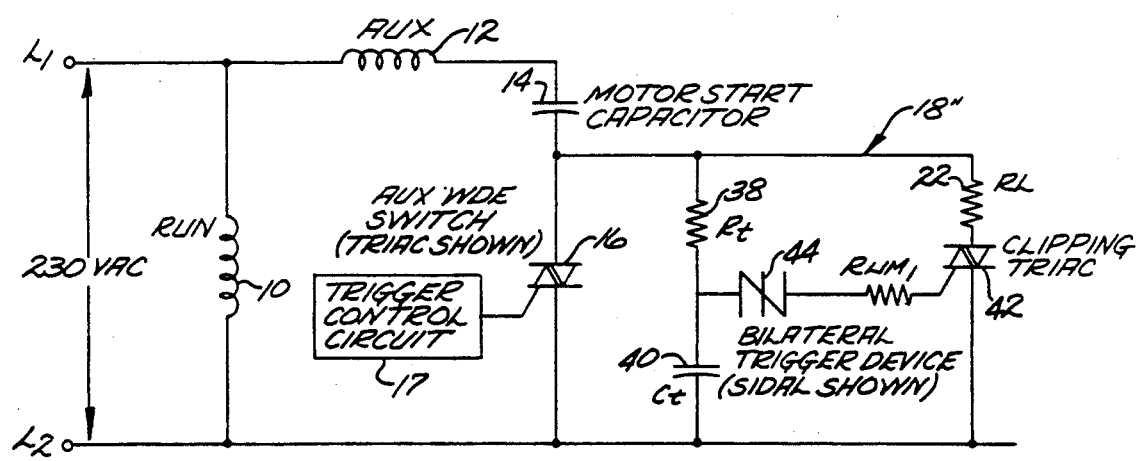

When using certain triggering control circuits the triac is normally de-energized on the same polarity so that an SCR can be used as the auxiliary winding switch, however in the event that it is de-energized on either polarity a bilateral switch, such as a triac 42 shown in FIG. 4, can advantageously be used as the triac voltage limiting switch. Protection circuit 18" of FIG. 4 responds to voltage of either polarity across the auxiliary winding switch exceeding a predetermined level, typically 700-800 volts and is similar to FIG. 3 with zener diode 36 replaced with a sidac trigger device 44 and without rectifying diode 34. The voltage across capacitor 40 increases at turn off of triac 16 until voltage of either polarity exceeds the breakover voltage level of trigger sidac 44 thereby turning the triac voltage limiting switch 42 on which then allows capacitor 40 to discharge into the gate of triac 42 turning it on. Once clipping triac 42 is on, the low resistance load resistor 22 is inserted drawing sufficient current momentarily to limit voltage across auxiliary winding switch 16 to a level below its rated breakdown level and with the stored peak charge on motor capacitor 14 rapidly discharged through motor windings 10 and 12.

The trigger level of clipping triac 42 is determined by the R-C time constant of resistor 38, capacitor 40 and the breakover level of bilateral trigger device 44. Although a sidac is indicated the trigger device can be any device exhibiting the general V-I characteristic of a SBS, sidac or diac.

Figure 5:
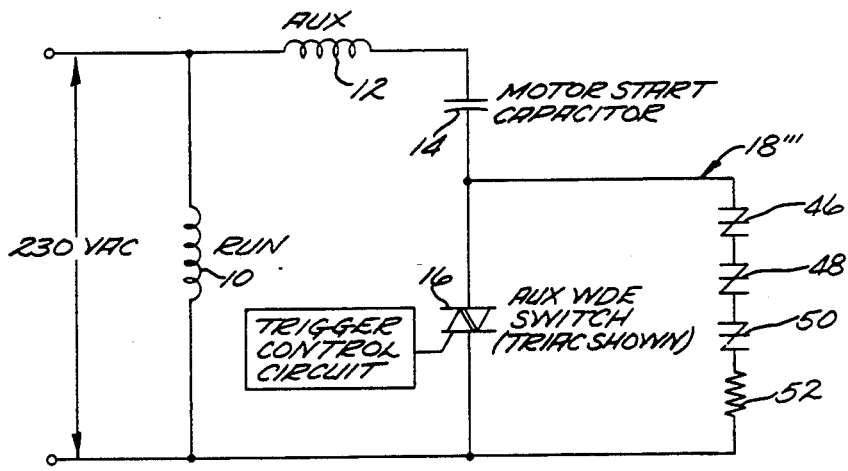

In FIG. 5 a further modification is shown comprising protection circuit 18''' in which a stack of bilateral triggering devices such as sidacs 46, 48, 50 are placed across auxiliary winding switch 16 with or without a limiting resistor 52. Typical values of sidacs 46, 48, 50 could be 250 volt, 250 volt, 220 volt respectively. With resistor 52 lower current rated sidacs can be employed. In any event when the voltage across auxiliary switch 16 increases to a selected value sidacs 46–50 will breakover forming a low resistance path around triac 16 thereby reducing the voltage across the triac.

Figure 6:
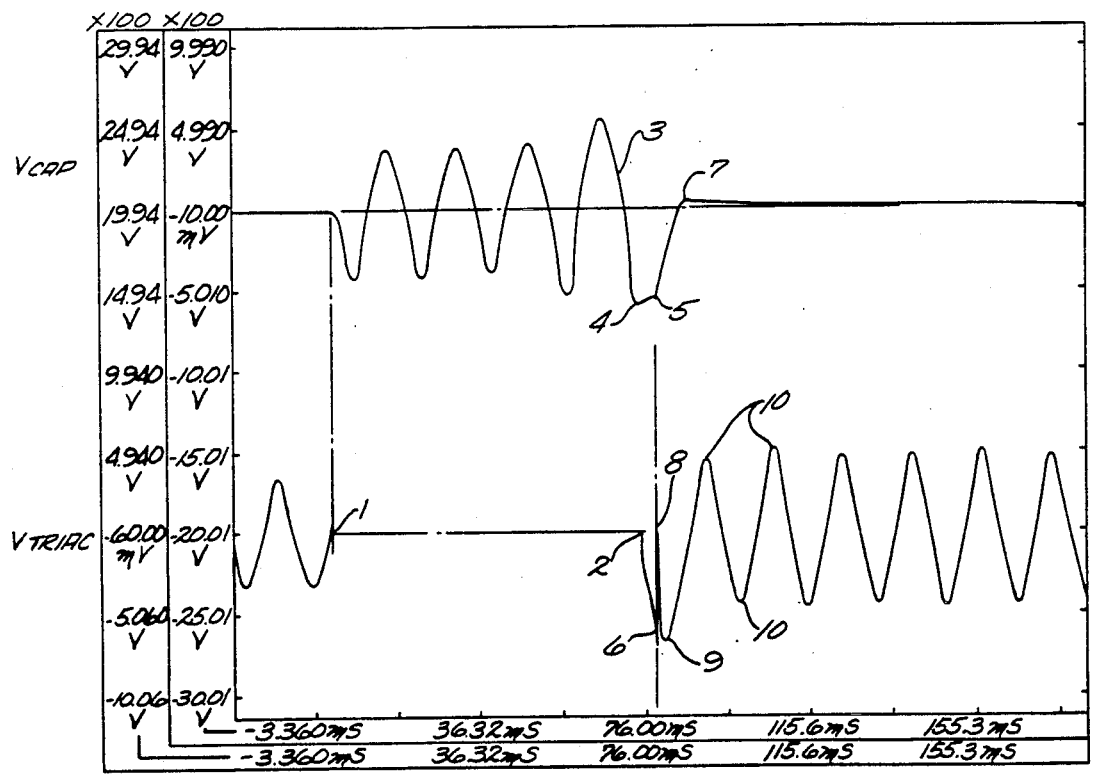
FIG. 6 is a trace of voltage across a motor capacitor and an auxiliary winding switch shown in FIG. 7.
Figure 7:
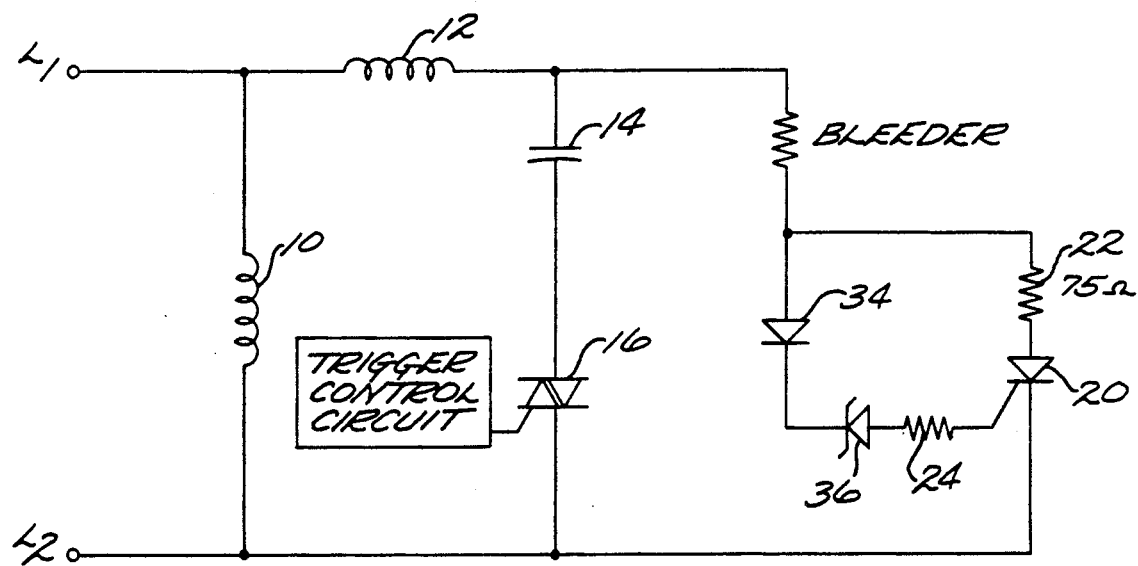
FIG. 7 is a diagram showing a protection circuit made in accordance with the invention.

FIG. 6 illustrates the protective action provided by the invention, the upper trace being the voltage across a motor capacitor and the lower trace the voltage across an auxiliary winding switch in the form of a triac arranged as shown in FIG. 7. At point 1 on the lower trace triac 16 turns on. At point 2 the triac turns off at zero current (or when the current through the triac drops below its holding current value). Numeral 3 shows the AC voltage across the motor capacitor 14 with the triac on. Point 4 shows the peak voltage charge left on the motor capacitor when the triac turns off. Between points 4 and 5 the voltage charge on the motor capacitor is slowly discharged by the bleeder resistor in parallel with the motor capacitor. Point 6 shows the triac voltage when the voltage across the triac reaches the clipping circuit trigger level. As seen between points 5 and 7 on the upper trace the motor capacitor is being discharged rapidly through the clipping circuit (SCR 20 and resistor 22), within 4–8 multiseconds typically. Point 8 shows the voltage across triac 16 with the clipping current SCR 20 on. Point 9 shows the reduced peak voltage across the triac (below its maximum rated value) due to the motor capacitor being discharged. Finally, point 10' shows the voltage across the triac due to the vector sum of main and induced start winding voltage.

Although the present invention has been fully described with reference to several preferred embodiments, many modifications and variations thereof will now be apparent to those skilled in the art, and the scope of the present invention is therefore to be limited only by the appended claims.

We claim:

1. A single phase AC induction motor comprising a main winding and an auxiliary winding both connectable to an AC power source, a start capacitor for providing a phase shifted field, auxiliary winding switch means for connecting and disconnecting the start capacitor and auxiliary winding to and from the AC source, auxiliary winding switch protection means including a gated semiconductor switch serially connected to a discharge resistor coupled across the auxiliary winding switch and a voltage breakdown device connected to the semiconductor switch and connected to be directly responsive to the voltage across the auxiliary winding switch, the breakdown device selected to breakdown at a voltage level to prevent excessive voltage appearing across the auxiliary winding switch.

2. A single phase AC induction motor according to claim 1 in which the auxiliary winding switch is a triac.

3. A single phase AC induction motor according to claim 2 in which the gated semiconductor switch is a triac.

4. A single phase AC induction motor according to claim 3 in which the breakdown device comprises a plurality of serially connected sidacs selected to breakdown at approximately 700 volts.

5. A single phase AC induction motor according to claim 3 in which the breakdown device is a sidac connected to the junction between a resistor and a capacitor coupled across the triac.

6. A single phase AC induction motor according to claim 2 in which the gated semiconductor switch is an SCR.

7. A single phase AC induction motor according to claim 2 in which the breakdown device comprise a plurality of serially connected zener diodes selected to breakdown at approximately 700 volts.

8. A single phase AC induction motor according to claim 2 in which the breakdown device is a zener diode connected to the junction between a resistor and a capacitor coupled across the triac.

9. A single phase AC induction motor according to claim 1 in which the auxiliary winding switch comprises back to back SCR's.

* * * * *